United States Patent [19]
Tiedje

[11] Patent Number: 5,944,903
[45] Date of Patent: Aug. 31, 1999

[54] EFFUSION CELL CRUCIBLE WITH THERMOCOUPLE

[76] Inventor: Henry Franklin Tiedje, 7 Market Street, Kitche. Ontario, Canada, N2K 1H1

[21] Appl. No.: 09/102,912

[22] Filed: Jun. 23, 1998

Related U.S. Application Data

[60] Provisional application No. 60/050,783, Jun. 25, 1997.

[51] Int. Cl.$^6$ ..................................................... C23C 14/00
[52] U.S. Cl. ............................................. 118/726; 392/389
[58] Field of Search ............................................... 118/726

[56] References Cited

U.S. PATENT DOCUMENTS

| | | | |
|---|---|---|---|
| 4,239,955 | 12/1980 | Cho | 392/389 |
| 4,426,569 | 1/1984 | Miller | 118/726 |
| 5,540,780 | 7/1996 | Hass | 118/715 |
| 5,714,008 | 2/1998 | Lee | 118/726 |

*Primary Examiner*—Richard Bueker

[57] ABSTRACT

A crucible with a thermocouple temperature sensor for use in a vapor effusion cell is disclosed. The upper portion of the crucible consists of a cup which contains a small quantity of the source material to be evaporated. A stem protruding from the base of the crucible has a deep well inside which a thermocouple is held, such that the thermocouple junction does not contact the crucible. The heat transfer to the junction is by radiation from the hot inner walls of the well. The junction temperature is slightly lower than, but reproducibly related to, the crucible temperature.

5 Claims, 7 Drawing Sheets

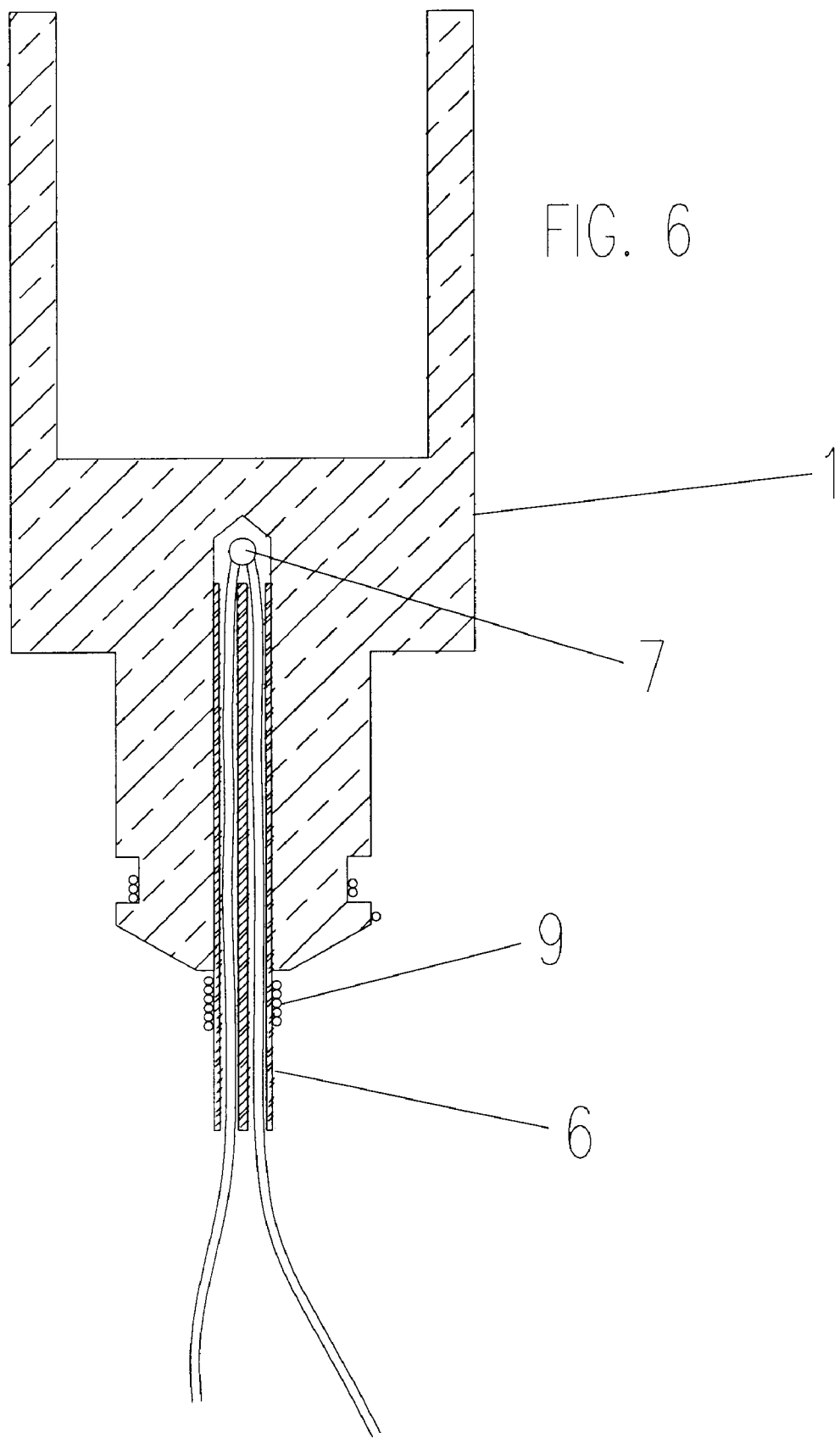

EFFUSION CELL CRUCIBLE WITH THERMOCOUPLE

This nonprovisional application claims benefit of the Provisional Application No. 60/050,783 with filing date Jun. 25, 1997.

BACKGROUND OF THE INVENTION

1. Field of the Invention

The present invention relates to vacuum deposition of thin films and molecular beam epitaxial (MBE) processing. In particular, the invention relates to the vapor effusion cell crucible which is the source of the molecular beam.

2. Description of Prior Art

A vapor effusion cell typically consists of a crucible containing a molecular source material, a heater to raise the crucible temperature, and a temperature sensor to measure the crucible temperature. In vacuum deposition of thin films, a vapor effusion cell is used to generate a molecular beam which condenses as a thin film on a substrate. A quantity of source material is placed in the crucible of an effusion cell and heated in vacuum to a temperature at which the material has sufficient vapor pressure for evaporation, so that a molecular flux emanates as a directed beam from the crucible. The substrate intercepts the beam such that the molecules of the beam condense on the substrate to form a thin film of the material.

For MBE film deposition, vapor effusion cells with precisely controlled molecular flux are required, particularly if several molecular beams are directed simultaneously at a common substrate, as in the deposition of the compound semiconductor gallium arsenide from separate gallium and arsenic effusion cells. In most effusion cell designs, the flux from the effusion cell is controlled by precise adjustment of the temperature of the source material, and means are provided for heating and measuring the temperature of an inert crucible containing the source material. For example, U.S. Pat. No. 4,239,955 describes a simple effusion cell for MBE which uses a thermocouple placed in a dimple in the base of the crucible to measure the crucible temperature. A more complex effusion cell which incorporates both temperature adjustment of the crucible and mechanical adjustment of the crucible orifice to control the molecular flux from the cell is disclosed in U.S. Pat. No. 5,714,008. An effusion cell with a thermocouple temperature sensor assembly heated by the thermal radiation from the crucible and the crucible heater is disclosed in U.S. Pat. No. 4,426,569. An effusion cell which uses an optical sensor to measure crucible temperature is disclosed in U.S. Pat. No. 5,540,780. More effusion cell designs are described in the following references:

S. H. Norrman, T. G. Andersson, S. P. Svensson and K. E. Flemming, "Highly Stabilised Evaporation Sources in a Water-Cooled Carousel Housing", J. Phys. E. Sci. Instrum., 15(7), pp.731–735 (1982) R. F. C. Farrow and G. M. Williams, "A High Temperature High Purity Source for Metal Beam Epitaxy", Thin Solid Films, 55, pp. 303–315 (1978)

R. A. Kubiak, P. Driscoll, and E. H. C. Parker, "A Simple Source Cell Design for MBE", J. Vac. Sci. Technol. 20(2), pp. 252–253 (1982)

Effusion cells with temperature sensors are calibrated by measuring the molecular flux from the crucible as a function of crucible temperature. For applications other than MBE deposition, such as the deposition of thin metal films used in the optics industry, precise control of molecular flux is often not required for satisfactory film deposition. Accordingly, for these applications, simple effusion cells are used which do not provide the means to measure the crucible temperature, and therefore cannot be conveniently calibrated. Typically, the deposited film thickness is monitored by a microbalance placed near the substrate, and deposition is terminated when the required film thickness is obtained. These effusion cells are usually called evaporation sources, and have the advantages of low cost and simplicity. Typical commercial evaporation sources are described in the *Vacuum Evaporation Sources Catalog* of the R. D. Mathis Company, P.O. Box 92916, Long Beach, Calif., 90809-2916. An example of an evaporation source from the R. D. Mathis Company consists of a model C9 molybdenum crucible installed in a model CH-10 crucible heater. The CH-10 is an electrical resistance heater with a tantalum sheet heating element and niobium radiation shields.

It is an object of the present invention to provide a low cost crucible with a thermocouple temperature sensor, which can be installed in a low cost commercial crucible heater such as the CH-10 crucible heater, so that a temperature controlled effusion cell can be realized at a cost comparable to that of an evaporation source without a crucible temperature sensor.

It is still another object of the present invention to provide a crucible which incorporates a simple means to secure a thermocouple temperature sensor inside a well (i.e. deep hole) within the base of the crucible, such that the thermocouple junction is substantially enclosed by the crucible bulk, but not in direct contact with the crucible. Thus, in a vacuum, heat transfer to the thermocouple is predominately by radiation, and the thermocouple temperature is slightly lower than, but reproducibly related to, the crucible temperature.

SUMMARY OF THE INVENTION

This invention is a crucible with a thermocouple temperature sensor, for use in an effusion cell. The crucible, temperature sensor and a crucible heater comprise the effusion cell. The heater is a standard commercial crucible heater such as the CH-10 made by the R. D. Mathis company.

An elongated stem with a deep well protrudes from the base of the crucible. The thermocouple temperature sensor is mounted inside the well. The deep well approximates a black body thermal radiation cavity at the temperature of the crucible, and when the wire leads to the thermocouple junction are sufficiently thin and the well is deep, then the thermocouple junction is approximately in thermal equilibrium with the crucible, and the temperature measured by the thermocouple is only slightly less than the actual crucible temperature. Radiation heat loss from the crucible due to the external surface area of the stem is minimized by making the stem diameter as small as possible without introducing a significant temperature gradient in the stem. The crucible is made of a high thermal conductivity refractory material, so that the entire crucible, including the stem, is at a nearly uniform temperature. Suitable refractory crucible materials are metals such as molybdenum, oxides such as $Al_2O_3$, pyrolytic boron nitride, or pyrolytic graphite. An electrically insulating refractory tube with two parallel bore holes is used to position the thermocouple inside the well, so that the thermocouple does not come into direct contact with the crucible. The tube protrudes from the base of the crucible and is held inside the well by a length of tungsten wire wrapped tightly around both the protruding end of the tube, and the base of the crucible. The tungsten wire is pre-formed into a large diameter coil and a small diameter coil. The large and small inside diameters of the preformed tungsten coils are slightly less than the diameters of the stem groove and tube, respectively. When the tungsten coils are installed over the tube and stem, the coils must expand slightly to accommodate the tube and stem, respectively. The small diameter tungsten coil tightly grips the tube, and the larger diameter section is captive in the annular groove around the outside of the stem. Thus the tube is secured in the well inside the stem, and the thermocouple junction and lead wires are held in a fixed position within the well by the tube. The thermocouple is fully supported by the tube, and no additional support structure is required. The thermocouple can be easily installed or replaced by the user, and any desired thermocouple type can be used. Since the thermal radiation density in the vicinity of the thermocouple junction is substantially uniform, the measured temperature is insensitive to small changes in junction position. When the power to the crucible heater is electronically controlled so that the thermocouple temperature is fixed at about 880° C., the typical crucible temperature variation in a one hour period is less than ±0.5° C.

BRIEF DESCRIPTION OF THE DRAWINGS

FIG. 6 is a cross sectional view of the crucible with the temperature sensor assembly installed.

DETAILED DESCRIPTION

Figure 2:
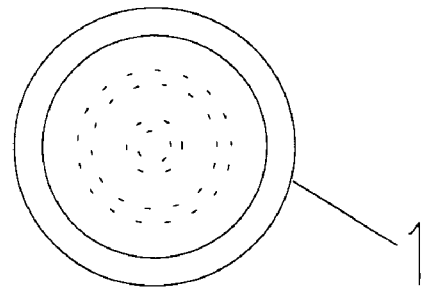
FIG. 2 is the top view of the crucible, looking along the center line.
Figure 1:
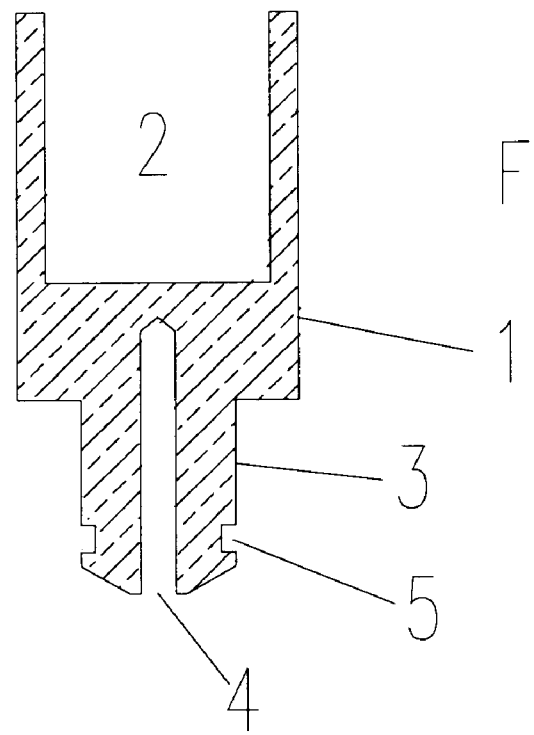
FIG. 1 is a cross sectional view of the crucible in the plane which contains the axis of rotational symmetry (center line) of the crucible.
Figure 3:
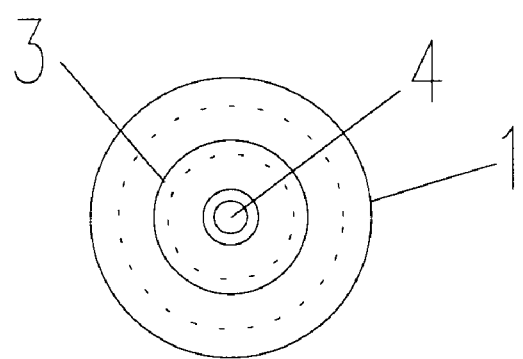
FIG. 3 is the bottom view of the crucible, looking along the center line.

FIG. 1 shows a cross-sectional view of the crucible, in the plane which contains the crucible rotational symmetry axis (center line). The crucible 1 has a cup 2 at the top which is used to hold a quantity of source material. A stem 3 at the base of the crucible has a deep well 4 into which the temperature sensor is placed. A shallow groove 5 encircles the outside surface of the stem. FIG. 2 shows a view of the crucible looking along the axis toward the cup end of the crucible. FIG. 3 shows the view of the crucible looking along the axis toward the stem end of the crucible.

Figure 5:
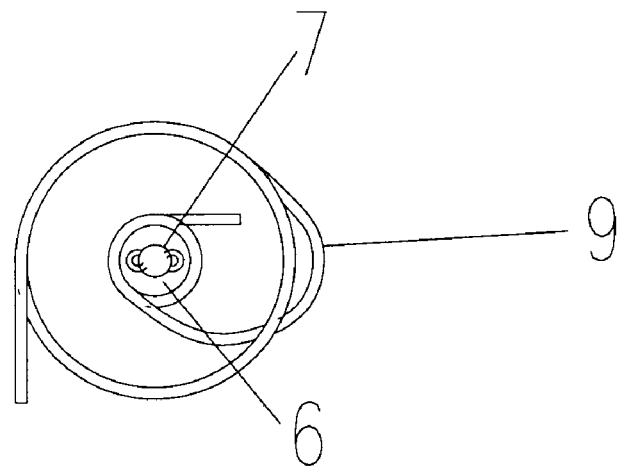
FIG. 5 is the view of the temperature sensor assembly, looking toward the end with the thermocouple junction.
Figure 4:
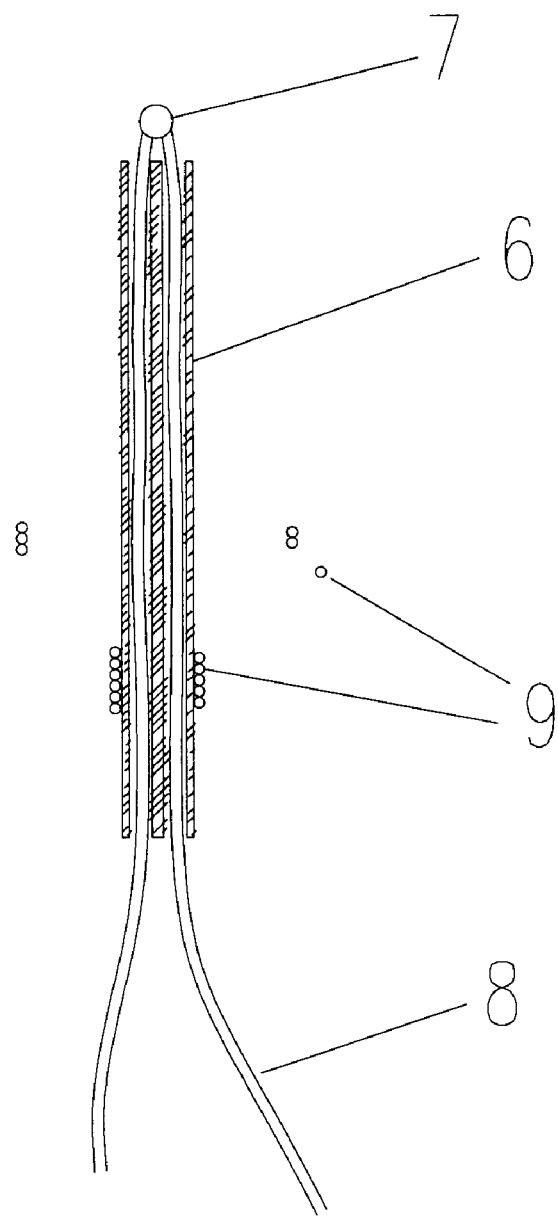
FIG. 4 is a cross sectional view of the temperature sensor assembly.

FIG. 4 shows a cross-sectional view of the temperature sensor assembly, in the plane which contains the rotational symmetry axis (center line) of the electrically insulating tube 6. The temperature sensor assembly consists of a thermocouple junction 7 which has lead wires 8 held by the tube. The tube has two bore holes parallel to the tube axis, along the full length of the tube. The lead wires to the thermocouple pass through the bore holes. One end of a tungsten wire 9 is wound as a single layer coil of about four turns, around the outside of the tube. The other end of the tungsten wire is formed in a coil of two or three turns, of the same inside diameter as the shallow groove 5. FIG. 5 shows an end view of the temperature sensor assembly, looking along the axis toward the thermocouple junction.

FIG. 6 shows a cross-sectional view of the crucible and the temperature sensor assembly, with the temperature sensor assembly installed in the crucible. The cross-section is in the plane which contains the common axis of the crucible and the temperature sensor assembly (common center lines). The temperature sensor assembly is held in place in the well 4 by the tungsten wire 9, which has one end wrapped around the stem 3 of the crucible in the groove 5, and the other end wrapped tightly around the outside of the tube 6. The thermocouple junction 7 is positioned as deep in the well as possible, without actually contacting the crucible.

Figure 7:
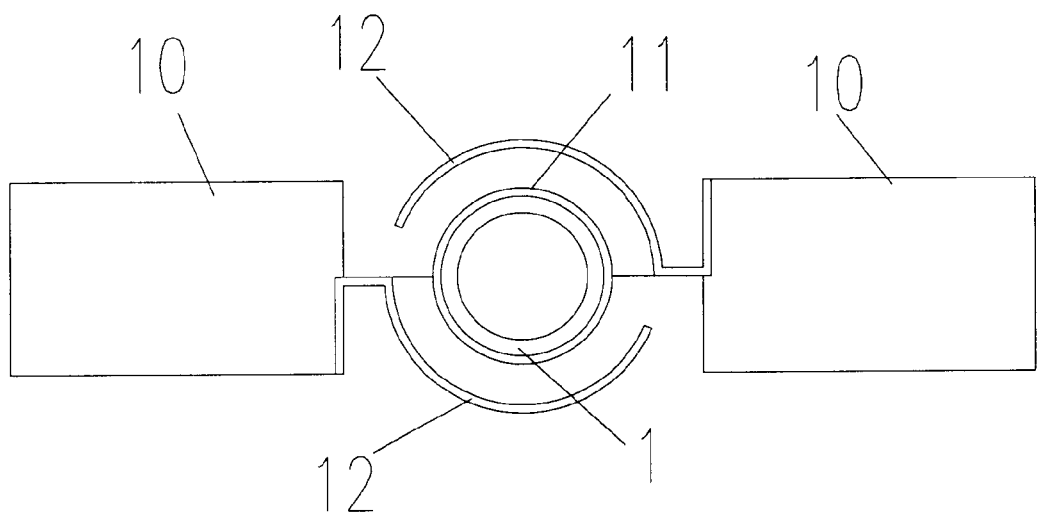
FIG. 7 is a top view of the crucible installed in a CH-10 crucible heater.
Figure 8:
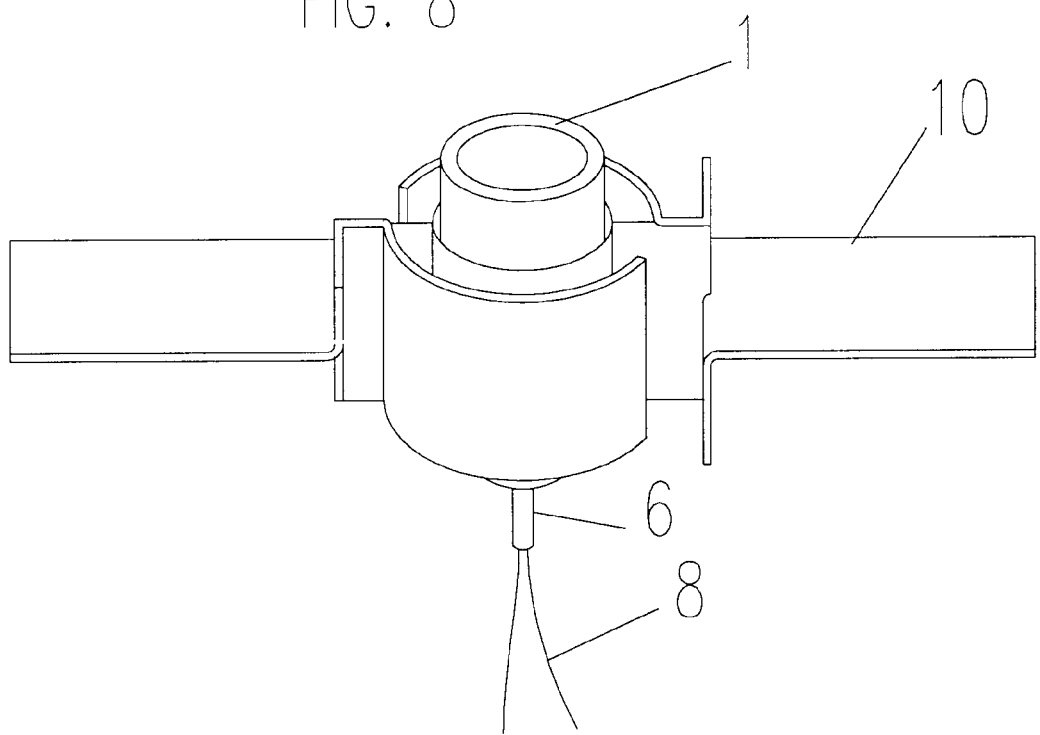
FIG. 8 is a perspective view of the crucible installed in a CH-10 crucible heater.

FIG. 7 shows the top view of the crucible with temperature sensor, when installed in a model CH-10 crucible heater manufactured by the R.D. Mathis company. The crucible heater consists of electrodes 10 which supply electrical current to the heater strips 11 which surround the crucible 1. Heat shields 12 reduce radiation heat loss. FIG. 8 shows the crucible, temperature sensor assembly and the heater as seen from an angle about forty five degrees from the center line view shown in FIG. 7.

Figure 9:
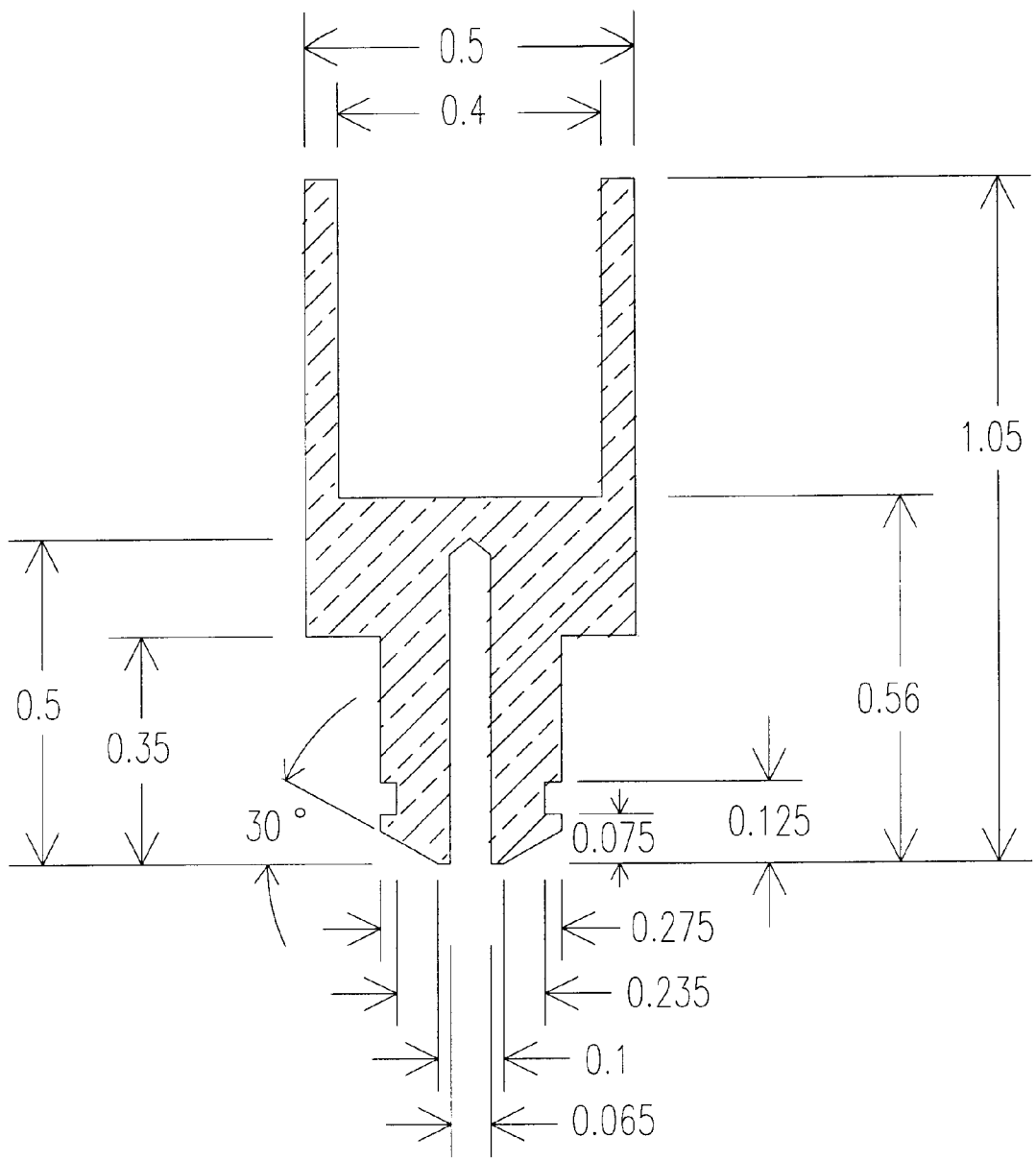
FIG. 9 shows the dimensions of the prototype crucible as machined from molybdenum

For test purposes, crucibles were machined to the dimensions shown in FIG. 9 from 0.5 inch diameter molybdenum rod. Thermocouple junctions were arc-welded from 0.01 inch diameter thermocouple wire in an argon atmosphere. Either Chromel vs. Alumel or tungsten with 5% rhenium vs. tungsten with 26% rhenium thermocouple alloy pairs were used. The tube is made from alumina ($Al_2O_3$) and has outside diameter $1/16$ inches, with two parallel bore holes running the length of the tube, each $1/64$ inches in diameter. The tungsten wire used to attach the tube to the crucible is 0.01 inches in diameter.

Figure 10:
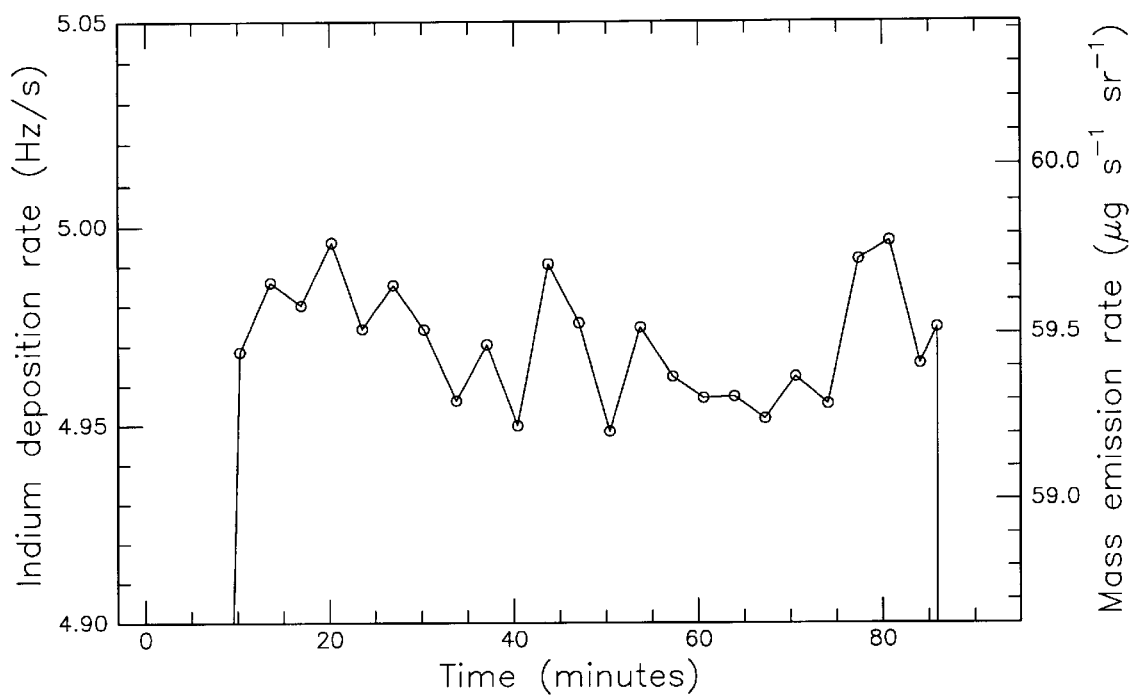
FIG. 10 is an effusion cell temperature stability test. The indium deposition rate is averaged over 3 minute intervals and plotted as a function of time.
Figure 12:
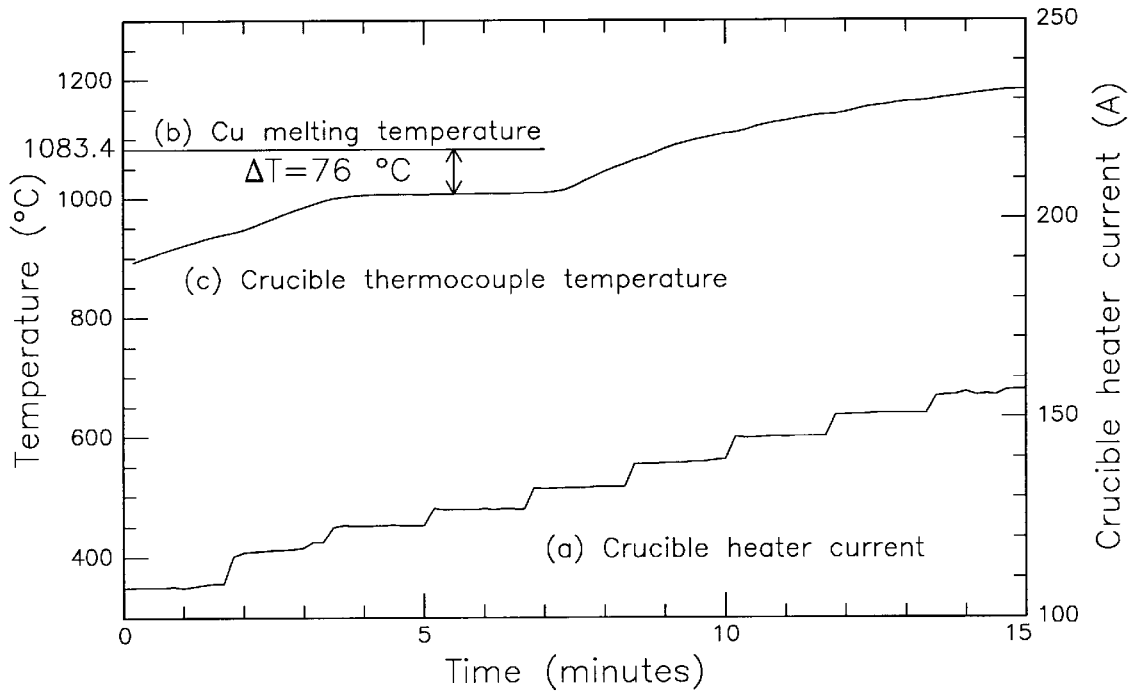
FIG. 12 shows a method for measuring the difference between the actual temperature of the crucible and the temperature of the thermocouple junction.
Figure 11:
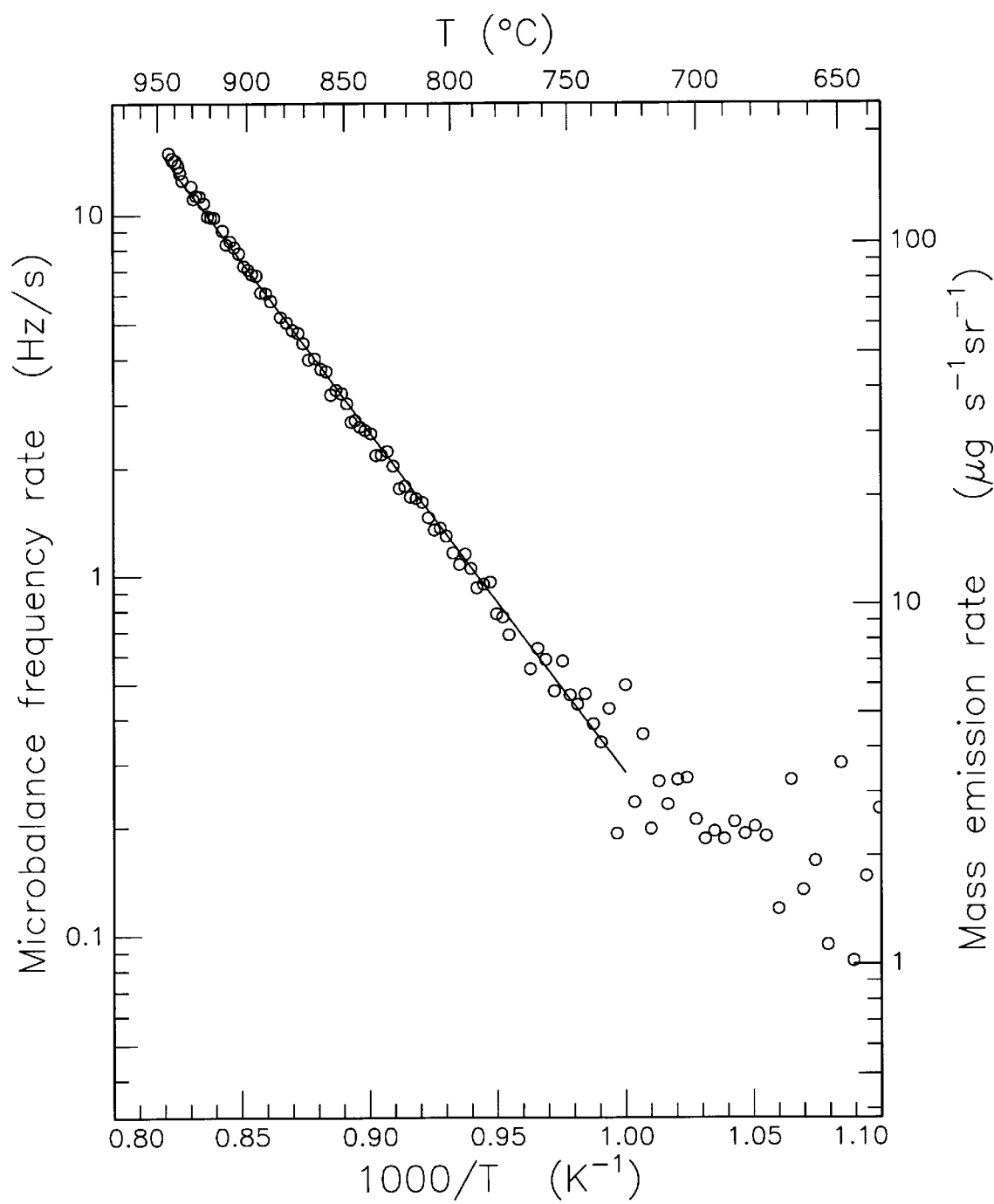
FIG. 11 is a plot of the logarithm of the deposition rate vs. the inverse absolute temperature for indium source material measured on the axis of the crucible with a quartz oscillator microbalance, at a distance of 26 cm from the top end of the crucible.

FIGS. 10, 11 and 12 show the results of tests conducted on effusion cells as shown in FIG. 8, each consisting of a crucible, a temperature sensor assembly and a CH-10 heater. The deposition rate vs. time for an effusion cell containing indium, with a Chromel vs. Alumel thermocouple is shown in FIG. 10. The crucible cup is about one third filled with indium metal, and the indium deposition rate is measured at a quartz crystal microbalance located on the crucible axis, 26 cm from the cup end of the crucible. The thermocouple junction is held at a constant temperature of 879° C. (1152 K) by a temperature controller, and at that temperature the indium deposition rate at the microbalance causes a 5 Hz/s rate of change of the microbalance oscillator frequency. This corresponds to an indium flux of $6 \times 10^{-5}$ g $s^{-1} sr^{-1}$ from the crucible in the axial direction. The deposition rate temperature dependence is proportional to the mass evaporation rate of indium from the crucible. For a liquid metal, the mass evaporation rate per unit surface area of the metal is given by $$G = CT^{-\frac{1}{2}}\exp\left(-\frac{\Delta H_v}{RT}\right)$$

where $\Delta H_v$ is the heat of vaporization, R is the universal gas constant, and C is independent of absolute temperature T. One can show using the above equation that at a particular temperature $T_0$, the relative change in evaporation rate $$\frac{dG}{G}$$

is given in terms of the relative change in absolute temperature $$\frac{dT}{T}$$

by the relation $$\frac{dG}{G} = -\left(\frac{S_0}{T_0}\right)\frac{dT}{T}$$

where $S_0$ is the slope of the plot of ln(G) vs. $T^{-1}$ evaluated at $T_0$. To simplify the calculation of the temperature variation dT, assume that the indium, thermocouple junction and crucible are in thermal equilibrium at temperature $T_0$.

A least squares fit to the ln(G) vs. $T^{-1}$ data of FIG. 11 is shown as a line through the data points. The slope of the line is multiplied by ln(10) to convert base 10 logarithms to natural logarithms. We find that $S_0 = -21815$ K at $T_0 = 1152$ K. We then have $$\frac{dG}{G} = 18.9\frac{dT}{T}.$$

From FIG. 10, the peak to peak relative variation in the deposition rate averaged over 3 minute intervals is about 1%. Therefore, the corresponding variation dT in the indium temperature, is $$dT = \frac{T}{18.9}\frac{dG}{G} = \frac{1152}{18.9}\frac{1}{100} \cong 0.6K$$

In practice, the thermocouple temperature is slightly less than the crucible temperature, because some heat flows away from the thermocouple junction along the thermocouple lead wires. FIG. 12 shows a method for measuring the temperature offset ΔT, the difference between the crucible temperature and the thermocouple junction temperature. Tungsten-rhenium wire was used for the crucible thermocouple in this test. The crucible cup is filled with copper shot, and the crucible is heated in vacuum until all of the copper melts. The copper is then allowed to cool and freeze. The copper wets the molybdenum crucible and forms a good thermal contact with the crucible. Next, the crucible is re-heated slowly by steadily increasing the electric current supplied to the CH-10 crucible heater. The heater current as a function of time is shown as curve (a) in FIG. 12. Since the copper heat of fusion must be supplied in order to melt the copper, the copper and crucible stay at the copper melting temperature until all the copper has melted. The temperature offset ΔT can be determined from FIG. 12 during the copper melting transition, as the difference between the known copper melting temperature at 1083° C., line (b), and the constant temperature region of the thermocouple temperature vs. time curve (c). We find therefore that ΔT=76° C., when the crucible temperature is 1083° C. The temperature offset can be reduced by using smaller diameter thermocouple wire.

Although the present assembly has been described with respect to a specific embodiment, it is understood that other configurations may also be developed and as such, the description herein is considered exemplary only. Therefore the present invention is deemed limited by the appended claims and the reasonable interpretation thereof.

What is claimed is:

1. An effusion cell crucible with temperature sensor comprising in combination:

a crucible which has an upper portion consisting of a cup to hold a quantity of source material and a lower elongated stem which includes a deep well for the placement of a thermocouple temperature sensor;

a thermocouple;

a length of electrically insulating tube with two bore holes parallel to the tube axis into which are placed the two leads of the thermocouple, such that the thermocouple junction rests at one end of the tube;

a length of tungsten wire formed into a small diameter coil to engage the tube and a larger diameter coil to engage an annular groove around the stem of the crucible; and an electrically resistive crucible heater assembly used to heat the crucible.

2. The crucible with temperature sensor set forth in claim 1 wherein the thermocouple is held in position by the tube.

3. The crucible with temperature sensor set forth in claim 2 wherein the tube is attached to the crucible by a length of tungsten wire, one end of which is wound tightly around the tube, and the other end is wrapped around the crucible stem in the annular groove.

4. The crucible with temperature sensor set forth in claim 3 wherein the thermocouple junction is positioned at maximum depth in the well, while neither the thermocouple junction nor the thermocouple lead wires come into contact with the crucible.

5. The crucible with temperature sensor set forth in claim 4 wherein the thermocouple junction is heated predominately by radiation heat transfer from the hot interior walls of the deep well in the crucible stem, and the thermocouple lead wires are of as small diameter as practical, in order to reduce heat conduction away from the thermocouple junction along the lead wires.

* * * * *